United States Patent
Iacopi et al.

(10) Patent No.: US 7,632,771 B2
(45) Date of Patent: Dec. 15, 2009

(54) UV LIGHT EXPOSURE FOR FUNCTIONALIZATION AND HYDROPHOBIZATION OF PURE-SILICA ZEOLITES

(75) Inventors: Francesca Iacopi, Leuven (BE); Salvador Eslava Fernandez, Leuven (BE); Christine Kirschhock, Korbeek Dijle (BE); Johan Martens, Huldenberg (BE)

(73) Assignees: IMEC, Leuven (BE); Katholieke Universiteit Leuven (KUL), Leuven (BE)

( * ) Notice: Subject to any disclaimer, the term of this patent is extended or adjusted under 35 U.S.C. 154(b) by 348 days.

(21) Appl. No.: 11/702,706

(22) Filed: Feb. 6, 2007

(65) Prior Publication Data

US 2007/0189961 A1 Aug. 16, 2007

Related U.S. Application Data

(60) Provisional application No. 60/771,073, filed on Feb. 7, 2006.

(51) Int. Cl.
*B01J 29/06* (2006.01)
*B01J 20/28* (2006.01)
*B01J 21/08* (2006.01)

(52) U.S. Cl. .............. 502/4; 502/5; 502/60; 502/77; 502/232; 423/702; 327/100

(58) Field of Classification Search .......... 502/60, 502/77, 4, 5, 232; 423/702; 327/100
See application file for complete search history.

(56) References Cited

U.S. PATENT DOCUMENTS

| 6,284,050 | B1 * | 9/2001 | Shi et al. .................. 118/715 |
| 6,630,696 | B2 | 10/2003 | Yan et al. |
| 6,960,327 | B2 * | 11/2005 | Navrotsky et al. .......... 423/130 |
| 2004/0096593 | A1 * | 5/2004 | Lukas et al. ................ 427/558 |
| 2005/0116346 | A1 * | 6/2005 | Kirner et al. ............... 257/758 |
| 2005/0282401 | A1 * | 12/2005 | Davis ........................ 438/780 |
| 2008/0118995 | A1 * | 5/2008 | Tamboli et al. ............... 438/4 |

OTHER PUBLICATIONS

Dattelbaum et al., J. Phys. Chem. B, 109 (2005) pp. 14551.
Li et al., Chem. Mater. 2005, 17, 1851-1854.

\* cited by examiner

*Primary Examiner*—Elizabeth D Wood
(74) *Attorney, Agent, or Firm*—Knobbe Martens Olson & Bear LLP

(57) ABSTRACT

A method is provided for making pure-silica-zeolite films useful as low-k material, specifically, more hydrophobic, homogeneous and with absence of cracks. The method utilizes a UV cure; preferably the UV cure is performed at temperatures at higher than the deposition temperature. The UV-assisted cure removes the organic template promoting organic functionalization and silanol condensation, making the silica-zeolite films more hydrophobic. Moreover, the zeolite material is also mechanically stronger and crack-free. The method can be used to prepare pure-silica-zeolite films more suitable as low-k materials in semiconductor processing.

25 Claims, 11 Drawing Sheets

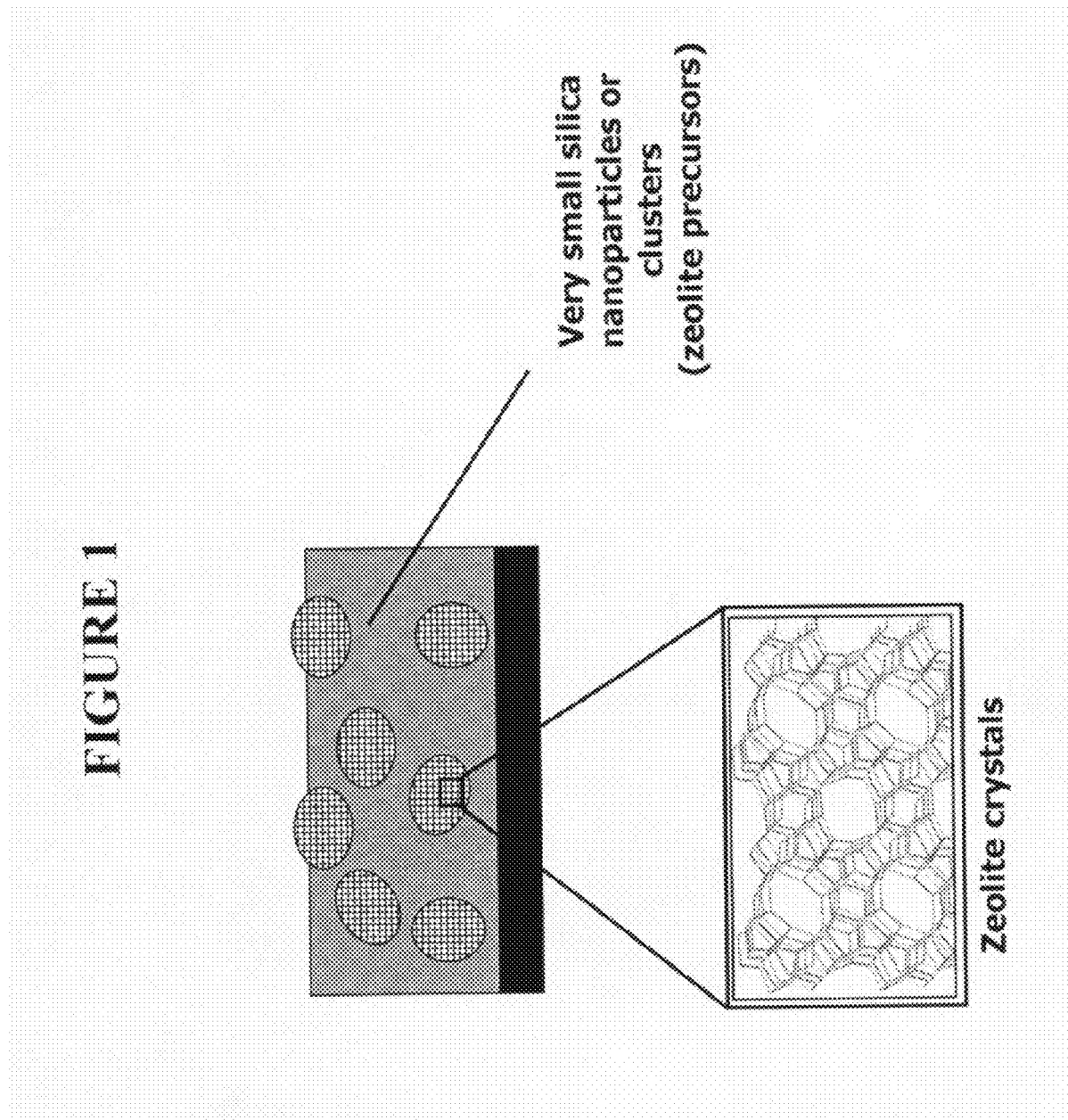

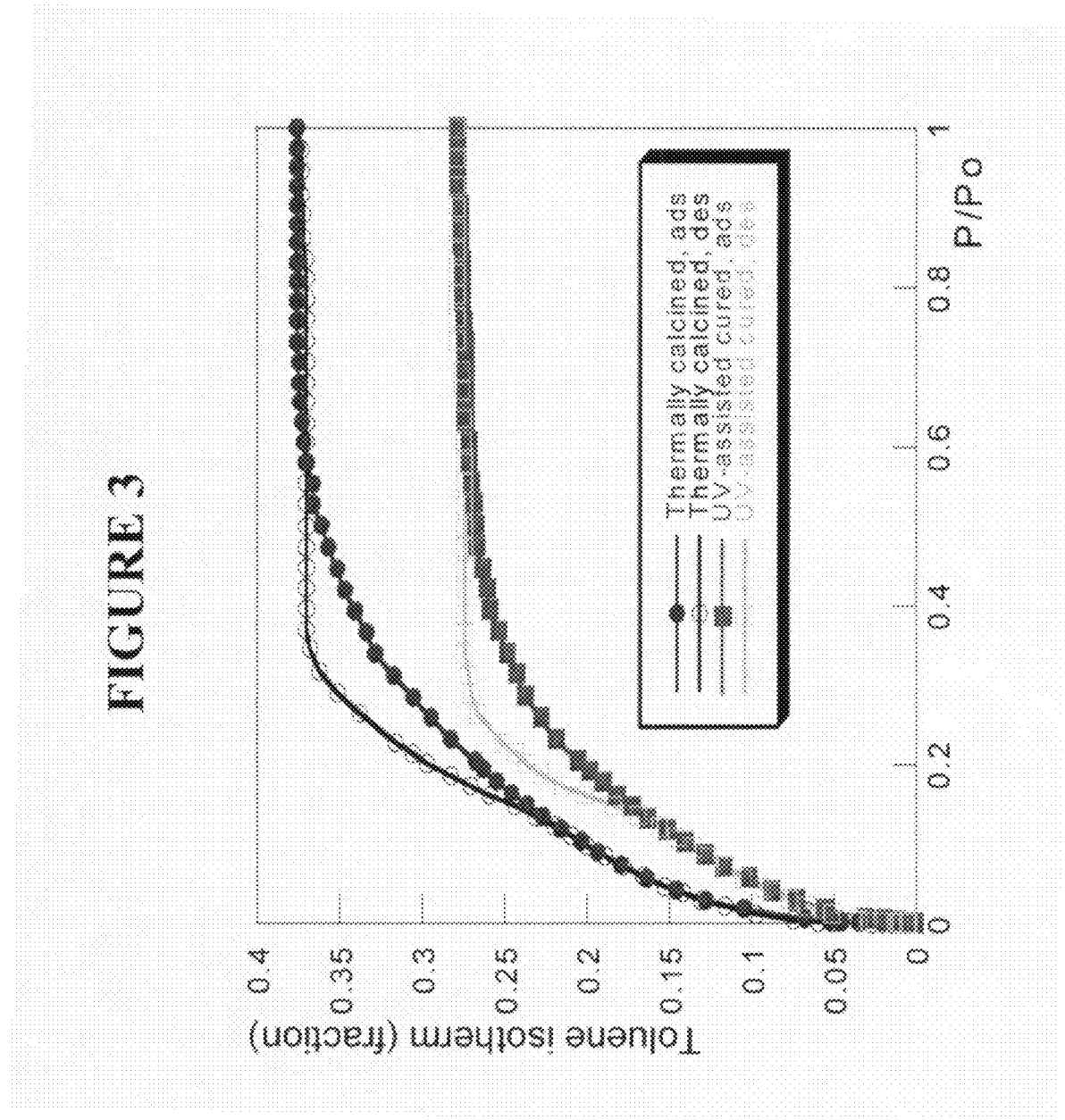

UV LIGHT EXPOSURE FOR FUNCTIONALIZATION AND HYDROPHOBIZATION OF PURE-SILICA ZEOLITES

CROSS-REFERENCE TO RELATED APPLICATION

This application claims the benefit under 35 U.S.C. §119 (e) of U.S. provisional application Ser. No. 60/771,073, filed Feb. 7, 2006, the disclosure of which is hereby expressly incorporated by reference in its entirety and is hereby expressly made a portion of this application.

FIELD OF THE INVENTION

A method is provided for making zeolite-films more hydrophobic, it also relates to the field of UV-cure. The methods are related to the field of semiconductor processing, and to membranes and membrane fabrication. More specifically, a method is provided for improving the properties of pure-silica zeolites (silicalites) and/or zeolite-like materials to be used as dielectric material in between interconnects in semiconductor devices.

BACKGROUND OF THE INVENTION

Pure-silica Zeolites as porous materials have found various commercial uses in the catalysis, adsorption, and ion exchange industries. Beside that, pure-silica zeolites find more and more applications in other areas because of their superior mechanical properties and porosity. In combination with their porous character leading towards a material with a low-dielectric constant, pure-silica zeolites are a strong candidate for a replacement low-dielectric constant (low-k) material for next-generation microprocessors. In order to survive the chemical-mechanical processing steps, the semiconductor industry generally acknowledges a minimum threshold value of 6 GPa (Young's Modulus) for these materials.

Pure silica zeolites have been proposed as low dielectric constant materials for interconnects the first time by Yan et al. (U.S. Pat. No. 6,630,696). The advantage of using pure-silica-zeolites as low-k material is the combination of crystallinity and porosity such that superior mechanical properties and high porosity can be obtained. The final properties can be tuned by using e.g. different crystalline structure (MFI, BEA, MEL . . . ), by tuning the crystalline/amorphous ratio in the synthesis of the films or by adding porogens to the pure-silica zeolite suspension. Typically, pure-silica zeolites have k values below 2.7.

A main showstopper however for the actual use of pure-silica zeolite materials as low-k films in interconnects is their hydrophilicity (contact angle with $H_2O$ typically lower than 20 degrees) which is a main issue in low-k dielectrics. The adsorption of moisture within the inner pores of the zeolites can results in a significant increase of the dielectric constant because water has a very high k value (k=80). Hence, it is important to make the zeolites material very hydrophobic to maintain a low-k value.

Post-deposition treatments were proposed in prior art to increase the hydrophobicity of a zeolites film. For example, vapor-phase silylation using chlorotrimethylsilane or hexamethyldisilazane to increase the hydrophobicity of a zeolite film. Since the pore size of silica zeolites is very small, the chlorotrimethylsilane molecules may encounter diffusion limitations and hence difficulties to access the silanol groups inside the zeolites micropores leading to limited increase in hydrophobization.

Dattelbaum et al. (J. Phys. Chem. B, 109 (2005) pp 14551) used a UV treatment to remove the organic template in a zeolites film after depositing said zeolite film, however no organic functionalization and hence no improvement is seen in the hydrophobicity of the zeolite film because only a photochemical decomposition and desorption of the organic material is performed.

Li et al. (Chem. Mater. 2005, 17, 1851-1854) proposes an organic functionalization of the zeolites crystals (and amorphous silica) during the synthesis of the zeolite nanoparticle suspension (prior to spinning). However the final zeolites film obtained after incorporation of said organic molecules to the silica matrix has a lower thermal stability and the increase in hydrophobicity is rather limited.

As a conclusion there is still a need for an efficient method that increases the hydrophobicity of a zeolite film without altering characteristics such as thermal stability and mechanical strength.

SUMMARY OF THE INVENTION

A method is disclosed for hydrophobization of pure-silica zeolite comprising films or in other words increasing the hydrophobicity of said silica-zeolite materials.

More specifically said method comprises the step of exposing the silica-zeolite film to UV light (also referred to as UV curing) in combination with thermal activation. The use of thermal activation during the UV treatment (exposure) is a key-factor in the preferred embodiments to realize organic functionalization, i.e., the photochemical reaction between the organic species and the silica matrix.

The UV treatment is preferably performed after depositing a silica-zeolite layer onto a substrate (support).

Said depositing step is preferably a spin-coating process but alternative processes such as in-situ crystallization, dip coating can be used.

After depositing a silica-zeolite film onto the substrate, a drying step can be performed. If a drying step is performed, said drying step is preferably performed at around 80° C. (e.g. for a few hours) but it should not totally remove the organics.

In a preferred embodiment, no further thermal treatment (e.g. additional bake) is needed after performing the drying step. The absence of a further thermal treatment to remove the organic template is unusual and in contrast to current state of the art methods. In the preferred embodiments it is recommended not to do a pre-UV thermal step such as an additional bake such that an optimal homogeneity is obtained and absence of cracks is seen.

In an alternative embodiment, there can be an additional heating or bake step after the drying step to remove part of the (organic) template present in the silica-zeolite layer but special care needs to be taken during said bake step to avoid total removal of the organic template such that organic functionalization during subsequent UV treatment still can take place. Said short bake step can be for example at approximately 300° C.

The UV exposure is preferably performed at low wavelengths, more preferred at wavelengths lower than 300 nm e.g. at wavelengths around 250 nm, more specifically in the range of 170 nm up to 250 nm.

The UV light exposure must be combined with a thermal activation. This means that the sample must be kept at a temperature preferably around 425° C. during the UV light exposure. This ensures good efficiency of the UV treatment.

If a thermal bake (using for example a bake temperature of around 300° C.) was performed prior to the UV treatment, the temperature in the tool during the UV light exposure is preferably higher, most preferred around 400° C., for example 425° C.

Said UV cure is preferably performed after the film deposition. If UV cure is performed after a partial removal of the organic template by means of thermal treatment, the final homogeneity or crack presence will not be optimal.

Using UV-curing, the O—H bond in the chemically bonded silanol groups (Si—OH) would be drastically decreased due to the formation of Si—O—Si cross-linking bridges, Si—CH$_3$ and/or Si—O—CH$_3$.

By using UV exposure part of the carbon present in the organic template is kept and found back linked to the silica matrix in the form of Si—CH$_3$ and/or Si—O—CH$_3$ functional groups, known to be effective hydrophobic groups.

The combination of removing the silanol groups and creating Si—O—Si, Si—CH$_3$ and/or Si—O—CH$_3$ groups will lead to a significant improvement in hydrophobicity. The lowest silanol content after UV-cure is found for spin-on zeolites with higher crystallinity ratio, that is, when a longer crystallization time is performed to obtain the pure-silica zeolite suspension.

To investigate the improvement in hydrophobicity of the silica-zeolite films contact angle measurements, preferably performed with a polar solvent such as H$_2$O, can be used. The results of said contact angle measurements (with water) indicate an improvement going from approximately 5 degrees (reference, almost completely wettable) up to higher than 100 degrees (typically 120 deg) after using the UV treatment of the preferred embodiments.

The increase of hydrophobicity is further related to large reduction of trapped physisorbed moisture, said moisture preferably being attracted towards chemically bonded silanol groups.

Furthermore, the enhancement of Si—O—Si cross-linking observed by FTIR will increase the final mechanical properties of the zeolites film.

The efficiency of the UV treatment of the preferred embodiments is dependent on the degree of crystallinity of the silica-zeolite film used.

Adding organic molecules to the zeolite film before UV light and temperature exposure, for example adding methyltrimethoxysilane to the synthesis solution, may further increase the organic functionalization and consequent hydrophobization.

Also provided is use of UV-treated silica-zeolites (with improved hydrophobicity) as low-k dielectric materials in between interconnect structures of a semiconductor device.

Also provided is use of UV-treated silica-zeolites (with improved hydrophobicity) as membranes.

Preferably, in a first aspect, the method for improving the hydrophobicity, functionalization, homogeneity and avoiding cracks and delamination of a zeolite film comprises the steps of forming a zeolite film on a support, wherein said zeolite film is derived from a zeolite synthesis composition comprising a silica source and an organic template; and subjecting said zeolite film to, substantially simultaneously, ultraviolet irradiation and thermal activation.

In an embodiment of the first aspect, said zeolite film is formed on said support by an in-situ crystallization process.

In an embodiment of the first aspect, said zeolite film is formed on said substrate by a spin-on process.

In an embodiment of the first aspect, forming a zeolite film on a support comprises depositing a suspension of zeolite nanocrystals having an average particle size of from about 50 nm to about 70 nm on said support.

In an embodiment of the first aspect, said suspension of zeolite nanocrystals further comprises at least one of smaller silica nanoparticles and clusters of smaller silica nanoparticles.

In an embodiment of the first aspect, said zeolite film comprises at least one zeolite selected from the group consisting of MFI zeolite, MEL zeolite, and BEA zeolite.

In an embodiment of the first aspect, said zeolite film is a pure-silica-zeolite film.

In an embodiment of the first aspect, said support is selected from the group consisting of a silicon wafer, a polymeric support, a porous alumina support, and a ceramic support.

In an embodiment of the first aspect, said silica source comprises an organic silica, for example, tetraethyl orthosilicate, tetramethyl orthosilicate, or mixtures thereof.

In an embodiment of the first aspect, said silica source comprises an inorganic silica, for example, fumed silica, silica gel, colloidal silica, or mixtures thereof.

In an embodiment of the first aspect, said organic template comprises an organic hydroxide, for example, a quaternary ammonium hydroxide such as tetrapropyl-ammonium hydroxide, tetraethylammonium hydroxide, triethyl-n-propyl ammonium hydroxide, benzyl-trimethylammonium hydroxide, or mixtures thereof.

In an embodiment of the first aspect, said thermal activation is conducted at a temperature higher than about 100° C.

In an embodiment of the first aspect, said thermal activation is conducted at a temperature higher than about 150° C.

In an embodiment of the first aspect, said thermal activation is conducted at a temperature higher than about 200° C.

In an embodiment of the first aspect, said thermal activation is conducted at a temperature higher than about 300° C.

In an embodiment of the first aspect, said thermal activation is conducted at a temperature from about 350° C. to about 550° C.

In an embodiment of the first aspect, said thermal activation is conducted at a temperature of about 425° C.

In an embodiment of the first aspect, ultraviolet irradiation is conducted at a wavelength lower than about 300 nm.

In an embodiment of the first aspect, ultraviolet irradiation is conducted at a wavelength lower than about 270 nm.

In an embodiment of the first aspect, ultraviolet irradiation is conducted at a wavelength of from about 170 nm to about 250 nm.

In an embodiment of the first aspect, the method further comprises a step of drying said zeolite film, wherein said drying step is conducted before the step of subjecting said zeolite film to, substantially simultaneously, ultraviolet irradiation and thermal activation.

In a second aspect, a zeolite film is provided that is prepared by a method comprising the steps of forming a zeolite film on a support, wherein said zeolite film is derived from a zeolite synthesis composition comprising a silica source and an organic template; and subjecting said zeolite film to, substantially simultaneously, ultraviolet irradiation and thermal activation.

In an embodiment of the second aspect, the zeolite film functions as a membrane.

In a third aspect, a semiconductor device comprising a zeolite film is provided, wherein the zeolite film is prepared by a method comprising the steps of forming a zeolite film on a support, wherein said zeolite film is derived from a zeolite synthesis composition comprising a silica source and an organic template; and subjecting said zeolite film to, substantially simultaneously, ultraviolet irradiation and thermal activation.

In an embodiment of the third aspect, the zeolite film functions as a low-k material.

BRIEF DESCRIPTION OF THE DRAWINGS

All figures/drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

FIG. 1 is a schematic diagram of a spin-on pure-silica-zeolite film.

As shown in FIG. 2A, the UV light exposure results in almost total removal of OH bonds (seen at 3400-3760 $cm^{-1}$). FIG. 2A also shows a peak at 2970 $cm^{-1}$ indicating C—H bonds. As shown in FIG. 2B, the UV light exposure results in almost total removal of OH bonds (seen at 980 $cm^{-1}$), the formation of Si—$CH_3$ bonds (seen at 1277 $cm^{-1}$) and an increase of Si—O—Si bonds (seen at approximately 1070 $cm^{-1}$ and relates to network bonding having a positive effect on mechanical properties). FIG. 2C shows IR peaks related to the organic functionalization relating to different peaks in range of 800 up to 900 $cm^{-1}$.

FIG. 3 illustrates adsorption of toluene in spin-on pure-silica zeolite films exposed to the UV-treatment of the preferred embodiments obtained by ellipsometric porosimetry. Total toluene percentage adsorbed is representative of the total porosity of the films.

DETAILED DESCRIPTION OF THE PREFERRED EMBODIMENTS

Figure 2A:
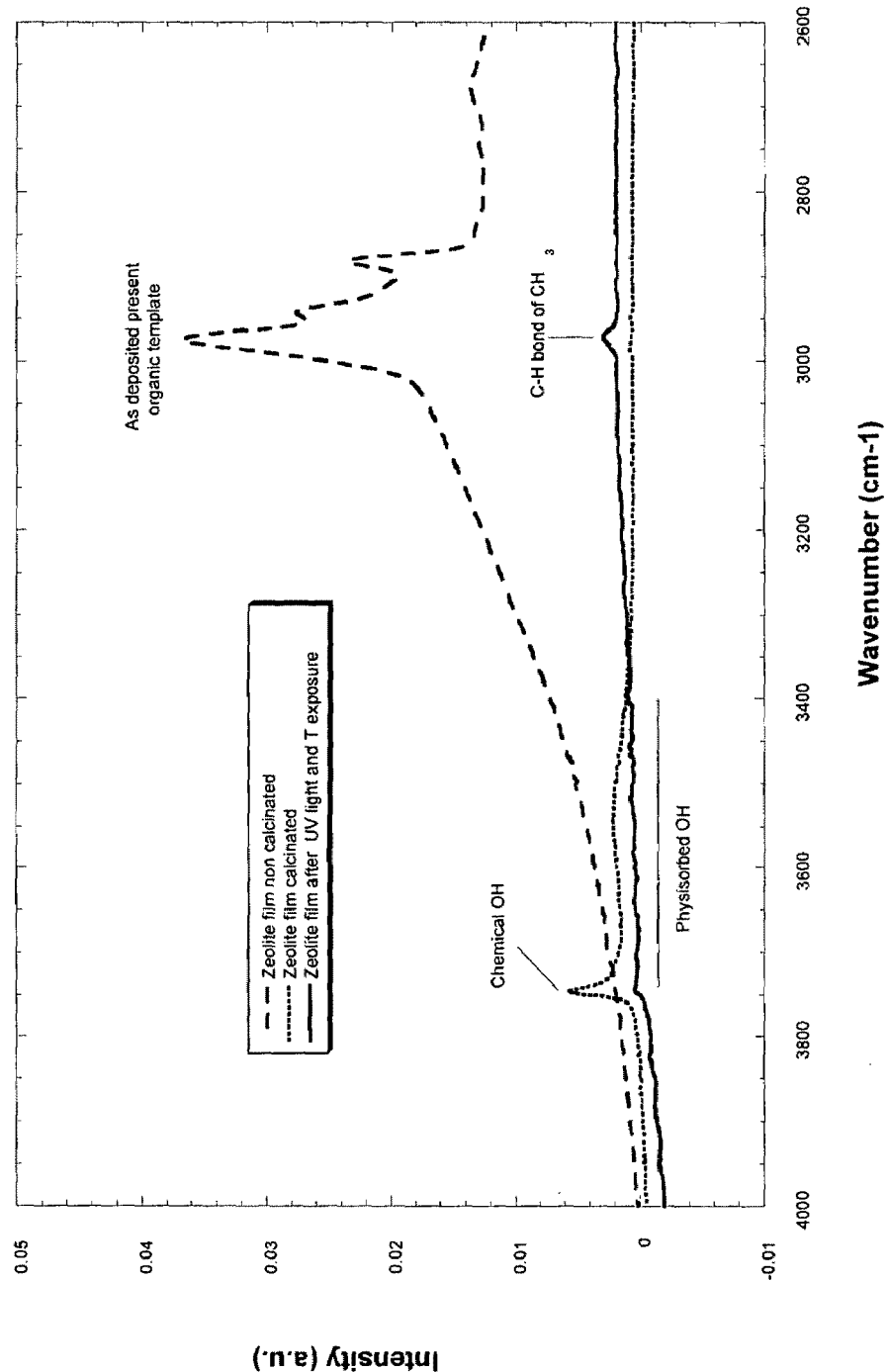
FIGS. 2A, 2B and 2C are Fourier Transform Infrared Spectroscopy (FTIR) spectra illustrating the use of UV light during the thermal removal of the template.
Figure 2B:
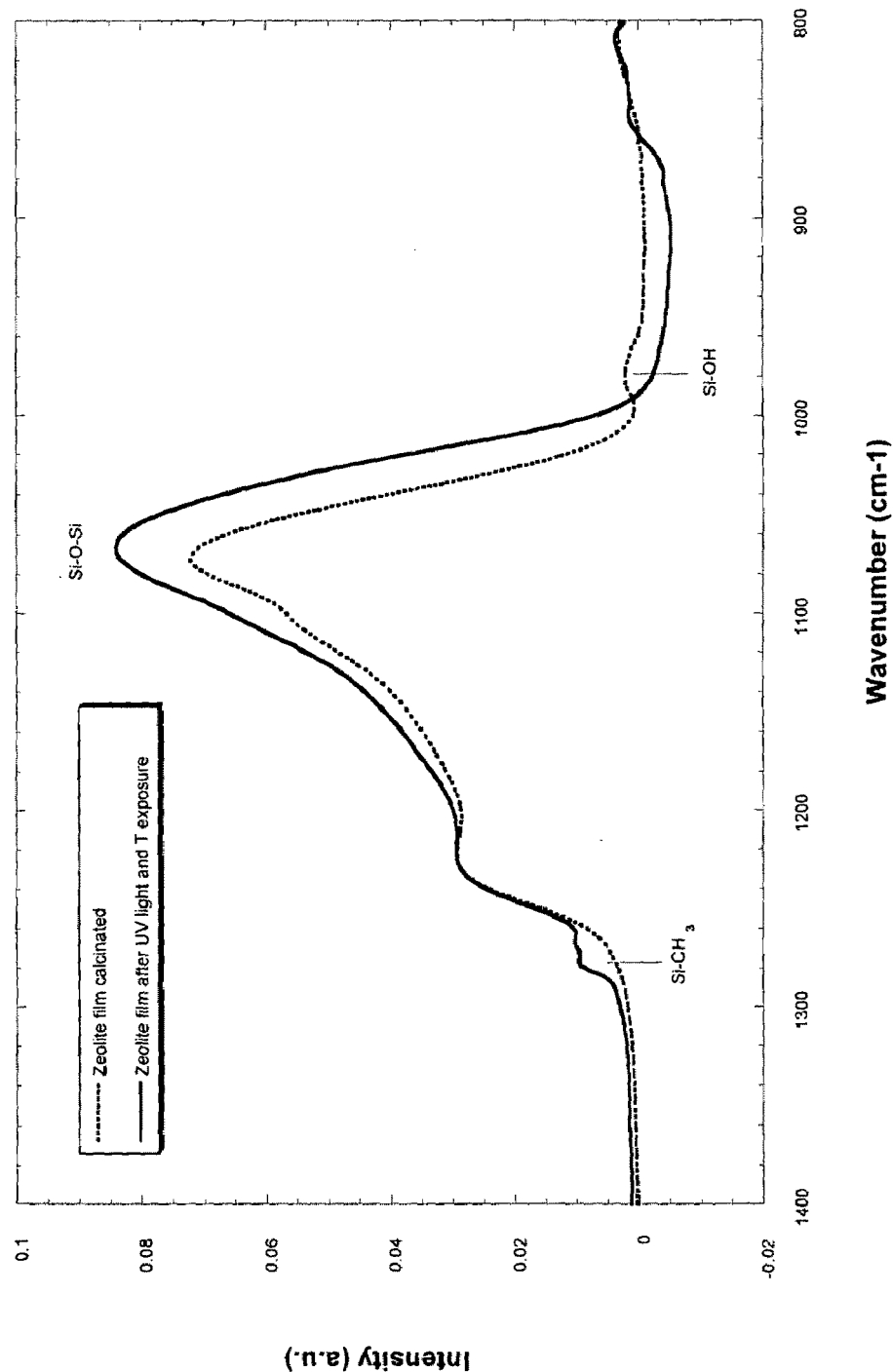
Figure 2C:
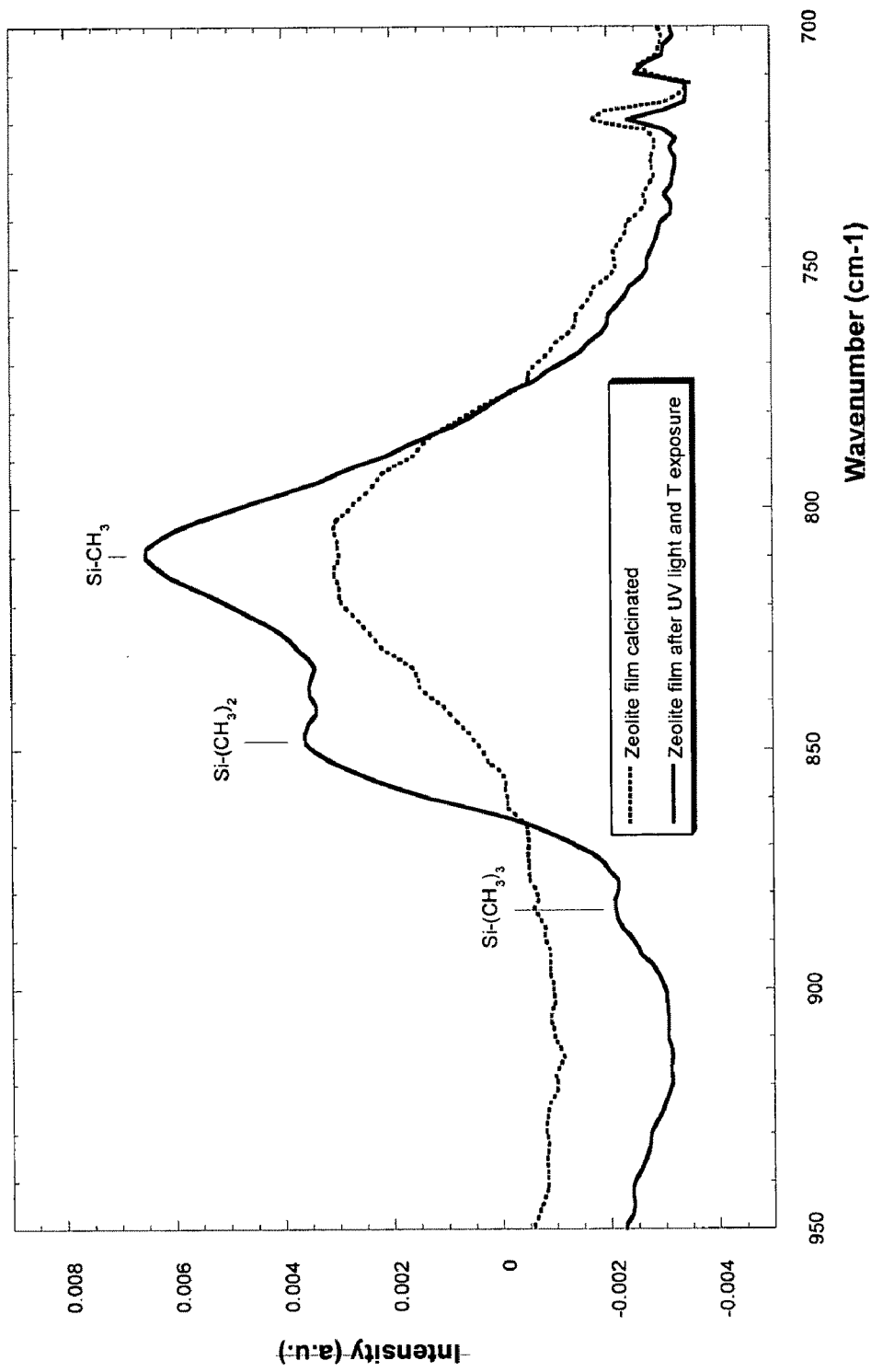
Figure 4:
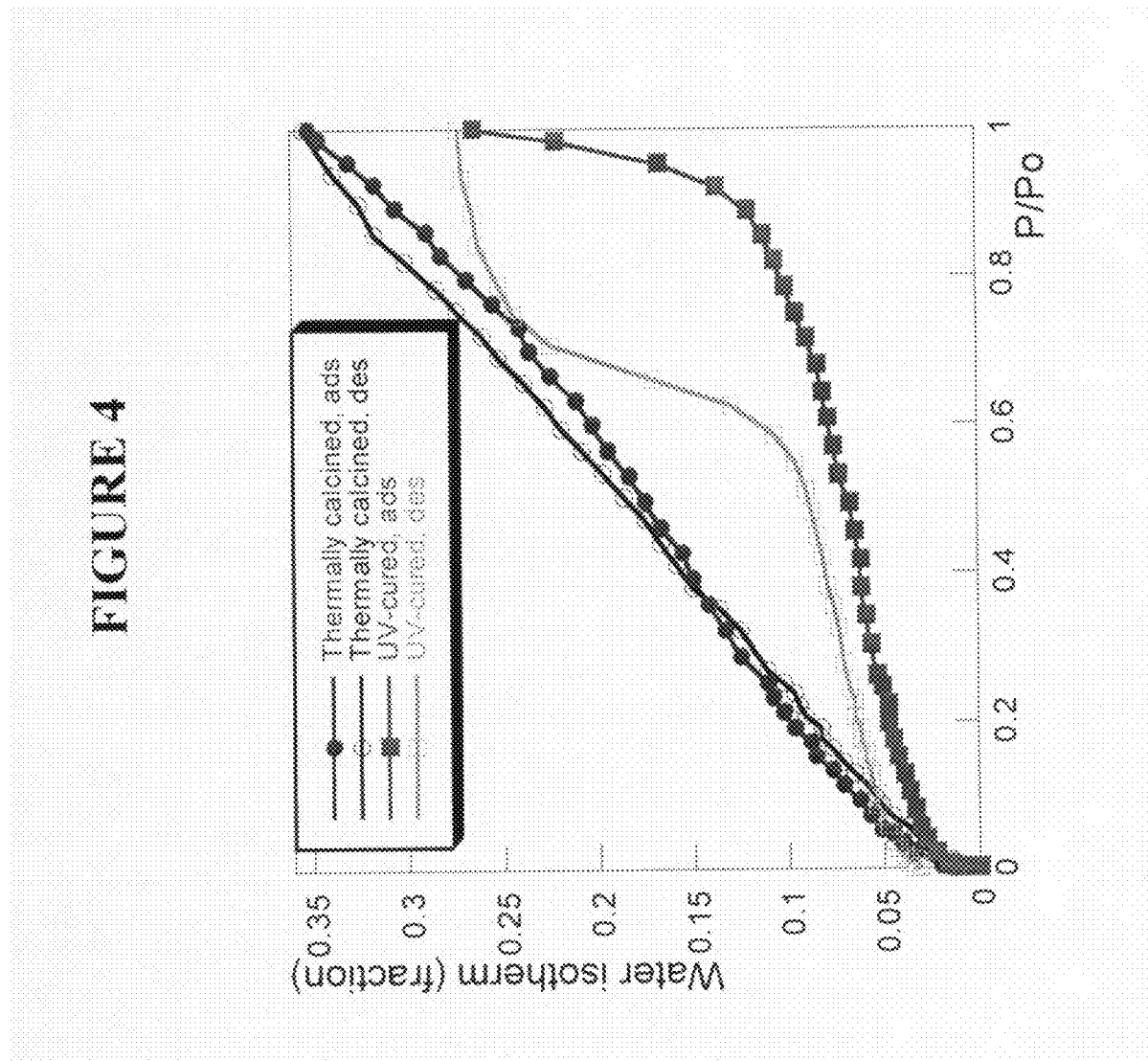
FIG. 4 illustrates water adsorption on a silica-zeolite film exposed to the UV-treatment of a preferred embodiment from ellipsometric measurements.

The following description and examples illustrate various embodiments of the present invention. It will be appreciated that there are numerous variations and modifications of these embodiments that are possible. Accordingly, the descriptions of the various embodiments should not be deemed to limit the scope of the invention, which is defined by the claims.

The term pure-silica zeolites as referred to in this application refers to zeolites having substantially an infinite ratio Si/Al. Said pure-silica zeolites can be made by combining a commercially available silica source with a commercially available organic zeolite-forming structure-directing agent (further referred to as organic template). Examples of pure-silica zeolites are MFI, BEA, MWW, LTA, CHA, MTW) The deposition can be done by in-situ crystallization or by spinning a suspension containing pure-silica-zeolite nanocrystals with 'glue holding entities' such as smaller silica nanoparticles (precursors of these nanocrystals).

The term organic "template" as referred to in this application is the structure-directing agent for the silica matrix formation (e.g. tetrapropylammonium). This must be removed to leave the pores empty, and this way decrease the k-value. In the preferred embodiments, the UV-cure in combination with thermal activation, is removing the template in a different way than a thermal calcination promoting organic functionalization The term hydrophobic as referred to in this application, refers to materials possessing the characteristic to have the opposite response to water interaction compared to hydrophilic materials. Hydrophobic materials ("water hating") have little or no tendency to adsorb water and water tends to "bead" on their surfaces (i.e., discrete droplets). Hydrophobic materials possess low surface tension values and lack active groups in their surface chemistry for formation of "hydrogen-bonds" with water.

Spin-on pure-silica-zeolite films as referred to in this application are deposited using a silica-zeolite solution in which silica-zeolite nanocrystals (50-70 nm) and smaller silica nanoparticles or clusters are present. The quantity of silica belonging to zeolite nanocrystals is usually low, for example around 30%. The zeolite nanocrystals themselves have a level of crystallinity and a particle size depending on the synthesis conditions (crystallization time, temperature . . . ). There is a trade-off between particle size and level of crystallinity of the nanocrystals. Usually, bigger crystals have better crystallinity but for the homogeneity of the films, small nanocrystals are necessary. The synthesis conditions are preferably optimized to obtain a small crystal size sacrificing crystallinity on them. Because of the non-perfect crystallinity on zeolite nanocrystals there are dangling bonds that contribute to the hydrophilicity of the films. These dangling bonds are reduced by the UV treatment as described in the detailed description proposed.

The smaller silica nanoparticles or clusters present originate from the hydrolysis of the silica source (e.g. TetraEthyl-OrthoSilicate (TEOS)) in the presence of an organic template (e.g. Tetrapropyl-ammoniumhydroxide (TPAOH)), and they are present always in zeolite synthesis prepared from a clear solution (clear solution is the term used in the preparation of zeolites nanocrystals for the clear homogeneous solution where only subcolloidal or discrete particles are present.

There are different theories about the mechanism of formation of the zeolite nanocrystals from a clear solution. For example in the mechanism proposed by Kirschhock and co-authors it is claimed that these small silica nanoparticles have slab shape, crystalline structure and aggregate till forming zeolite nanocrystals. Said smaller silica nanoparticles or clusters, due to their small size, have a high surface area and consequently, high quantity of silanol groups. In spite of having a high surface area, their small size permits to obtain homogeneous films because they are able to fill the voids among the pure-silica-zeolite nanocrystals (50-70 nm). Said smaller nanoparticles work as 'glue holding entities' of the zeolite nanocrystals. However, their presence makes these films hydrophilic.

In comparison with the zeolite nanocrystals, the part of the films containing the small silica nanoparticles or clusters have much higher concentration of dangling bonds because of their high internal surface area. Hence, this part of the film could have more active sites for the UV-cure.

A method is provided for improving the hydrophobicity or in other words reducing or substantially eliminating the hydrophilicity of pure-silica-zeolite films.

The reason for the hydrophilicity of said pure-silica-zeolites is the use of crystal grains smaller than 100 nm in combination with the use of zeolite precursors as 'glue holding entities' of the zeolite nanocrystals. This leads to a high internal surface area full of Si—OH terminating groups.

The preferred embodiments relate to a new post-deposition method to induce hydrophobization of spin-on silicalite-1 films during the removal of the organic template. The method comprises of a wide-band UltraViolet (UV) irradiation combined with thermal activation. The hydrophobization is obtained because the UV-treatment decreases drastically the quantity of silanols and makes the organic template react with the silica matrix forming hydrophobic Si—$CH_3$ groups while desorbing. The Si—O—Si bond angle decreases and moreover, the formation of cracks larger than 50 nm is avoided.

The method of the preferred embodiments comprises the step of exposing the silica-zeolite film to UV light and temperature. Said UV treatment is done after the deposition of a silica-zeolite film onto a substrate. Several methods are described in literature to perform the deposition of a silica-zeolite film onto a substrate. Preferred methods are e.g. spin-on or in-situ crystallization.

After the deposition step, the pure-silica-zeolite film can be dried; said drying can be performed for example overnight (several hours). The substrate can be heated during drying e.g. up to 80° C. but it should not totally remove the organics.

In a preferred embodiment, no further thermal treatment (e.g. additional bake) is needed after performing the drying step. The absence of a further thermal treatment to remove the organic template is unusual and in contrast to current state of the art methods. In the preferred embodiments, it is recommended not to do a pre-UV thermal step such as an additional bake such that an optimal homogeneity is obtained and absence of cracks is seen.

Optionally but not preferred there can be an additional bake step before performing the UV treatment. Said bake step is used to remove part of organic material present in the silica-zeolite film. Said organic material is originating from the template and/or solvent used in the starting solution. Special care needs to be taken that there is still a residual amount of organic template available in the silica-zeolite film to obtain organic functionalization during subsequent UV treatment.

The UV treatment is preferably performed at wavelengths smaller than 300 nm. Applying said wavelengths can break the O—H bonds. Additionally the substrate comprising the silica-zeolite film is heated during the UV treatment to improve the UV treatment. The removal of silanol groups makes it possible to create new Si—O—Si cross-linking bridges. Also, upon UV exposure part of the C present in the organic component of the template is kept and found back in the form of Si—$CH_3$ and/or Si—O—$CH_3$ functional groups (referred to as organic functionalization), said —$CH_3$ and/or —O—$CH_3$ groups known to be effective hydrophobic groups. Solvents (if still presents) used could contribute to the organic functionalization but less likely, due to their high volatility.

During organic functionalization, Si—OH bonds are drastically decreased and new bonds appear, including Si—$CH_3$ and/or Si—O—$CH_3$. An advantage of creating Si—$CH_3$ and/or Si—O—$CH_3$ bonds in the films is the fact that the density of the films is still low.

The UV treatment of pure-silica-zeolite films, with sufficient amount of organic template, will result in a significant improvement of hydrophobicity due to the removal of hydroxyl groups and the organic functionalization.

The removal of hydroxyl groups by means of silica condensation to form hydrophobic siloxane Si—O—Si bond will avoid moisture adsorption but has the tendency to increase the density of a pure-silica-zeolite film.

Said Si—O—Si bonds create new cross-linking bridges in the silica-zeolite film, leading towards higher mechanical strength. The decrease of the large Si—O—Si bonds lead towards improved mechanical properties.

To keep the density of the material low, it is preferred to have also significant degree of organic functionalization (meaning incorporation of "$CH_3$" groups). The density of a material, more specifically of a zeolites type material, is influenced by formation of firstly Si—O—Si bonds by silanol condensation which increases the density due to the (increased level) cross-linking. Secondly, by the formation of Si—$CH_3$ or Si—O—$CH_3$, this also increases the density as more atoms fill the pores. In the UV treatment of the preferred embodiments, all the above mentioned effects end up in an increase of density.

During organic functionalization, Si—OH bonds are transformed into Si—$CH_3$ and/or Si—O—$CH_3$ bonds.

The introduction of new cross-linking bridges during UV treatment is mainly taking place in the amorphous part of the films because the amorphous part has significant higher concentration of silanol groups. Said Si—O—Si bonds create new cross-linking bridges in the pure-silica-zeolite film, leading towards higher mechanical strength.

Improvement in hydrophobicity can be investigated by means of ellipsometric porosimetry measurements (also referred to as ellipsometric measurements) as described in EP1722213 by Baklanov et al. Alternatively contact angle measurements with $H_2O$ can be performed. For a reference material (having complete wetting with water) the contact angle is typically ~5 degrees. After UV treatment of the silica-zeolite film contact angle values of 100 degrees and higher can be obtained (typically 120 deg).

The removal of chemically bonded silanols can also be investigated by FTIR showing that after UV treatment a silica-zeolite film has a large reduction of trapped physisorbed moisture.

The organic functionalization and consequent hydrophobization can be further increased by adding more organic molecules to the zeolite film before UV light and temperature exposure to promote higher organic functionalization, for example methyltrimethoxysilane.

The silica-zeolite films after UV treatment of the preferred embodiments can be used as low-k dielectric material (i.e. material having a dielectric constant lower than the dielectric constant of $SiO_2$) in between (metallic) interconnect structures in a semiconductor device.

EXAMPLES

Example 1

Depositing a Silica-Zeolite Film

Zeolite films can be deposited in several ways: in-situ crystallization, spin-on of a zeolite particle suspension, dip-coating of a zeolite particle suspension, etc.

As described in this example and used as sample in further examples, spin coating can be used as deposition method and is performed as described below.

For the examples, spin-on pure-silica-zeolite MFI films are following the recipe proposed by Yan et al. (U.S. Pat. No. 6,630,696).

In that recipe, a clear solution is obtained with a molar composition of 1 Tetrapropyl-ammoniumhydroxide (TPAOH)/2.8 $SiO_2$/22.4 Ethanol/40 $H_2O$. This clear solution is aged under stirring at ambient temperature and then heated up to 80° C. during 3-5 days capped in a plastic vessel. Then, the nanoparticle suspension obtained is centrifuged at 5000 rpm for 20 minutes to remove big particles. The suspension is spun on Si wafers (substrates) at 3300 rpm during 20-30 seconds. The film obtained can be dried at 80° C. overnight.

Example 2

UV Treatment of a Zeolite Film

For the examples, a single wafer UV exposure system (RapidCure™ from Axcelis) tool was used. Exposure with a microwave-driven electrodeless bulb emitting UV light with a broadband spectrum was used. Inert gas ambient and ambient pressure was used. The wafer (substrate) with the pure-silica-zeolite film on top of it sits on a thermo chuck at temperature of 425° C. The exposure time is 5 minutes and the spectrum of the UV emission is lower than 300 nm.

Example 3

Yield Measurements (Crystallinity)

The synthesized silica-zeolite film had around 30% of zeolite nanocrystals (yield). The yield of said silica-zeolite film after deposition is the percentage of silica belonging to zeolite nanocrystals in the order of 50-70 nm. Thus, the final films in the example have around 30% of silica nanocrystals and the rest is amorphous silica. This amorphous phase contains zeolite seeds responsible of the creation of the silica nanocrystals, possibly nanoslabs and/or nanotablets as proposed by Kirschhock and co-authors.

Example 4

Porosity Measurements

Zeolite films of the example without UV treatment have an open porosity of 37.6%, measured by Ellipsoporosimetry with toluene.

In the case of UV treated the porosity is decreased to 27.9% because the film becomes denser.

Moreover there is an increase of refractive index in agreement with the densification of the film.

Clearly, the structure of the pure-silica-zeolite film is more cross-linked.

FIG. 3 illustrates the porosity of the pure-silica-zeolite film exposed to UV from Ellipsometric measurements performed with toluene.

Example 5

Contact Angle Measurements

The silica-zeolite film after UV-cure treatment according to a preferred embodiment (having a thermal activation during UV exposure) was evaluated for hydrophobicity by performing contact angle measurement.

For a given droplet on a substrate the contact angle is a measurement of the angle formed between the substrate and the line tangent to the droplet radius from the point of contact with the substrate.

The contact angle is related to the surface tension by the Young's equation through which the behavior of specific liquid-solid interactions can be calculated. A contact angle of zero results in complete wetting of the substrate, while an angle between 0 and 90 results in spreading of the drop (due to molecular attraction). Angles greater than 90 indicate that the liquid tends to bead or shrink away from the substrate, in case water is the liquid, the substrate can be interpreted as a hydrophobic substrate.

Contact angle measurements were done with water and a contact angle value of 118 (error is +−5) degrees was calculated fitting the curve to a Young-Laplace equation.

Example 6

Reduction of Cracks

Zeolite films containing an amorphous part suffer shrinkage during the removal of the template by thermal treatment. This shrinkage is mainly related to the amorphous part among nanocrystals.

Figures 5A, 5B:
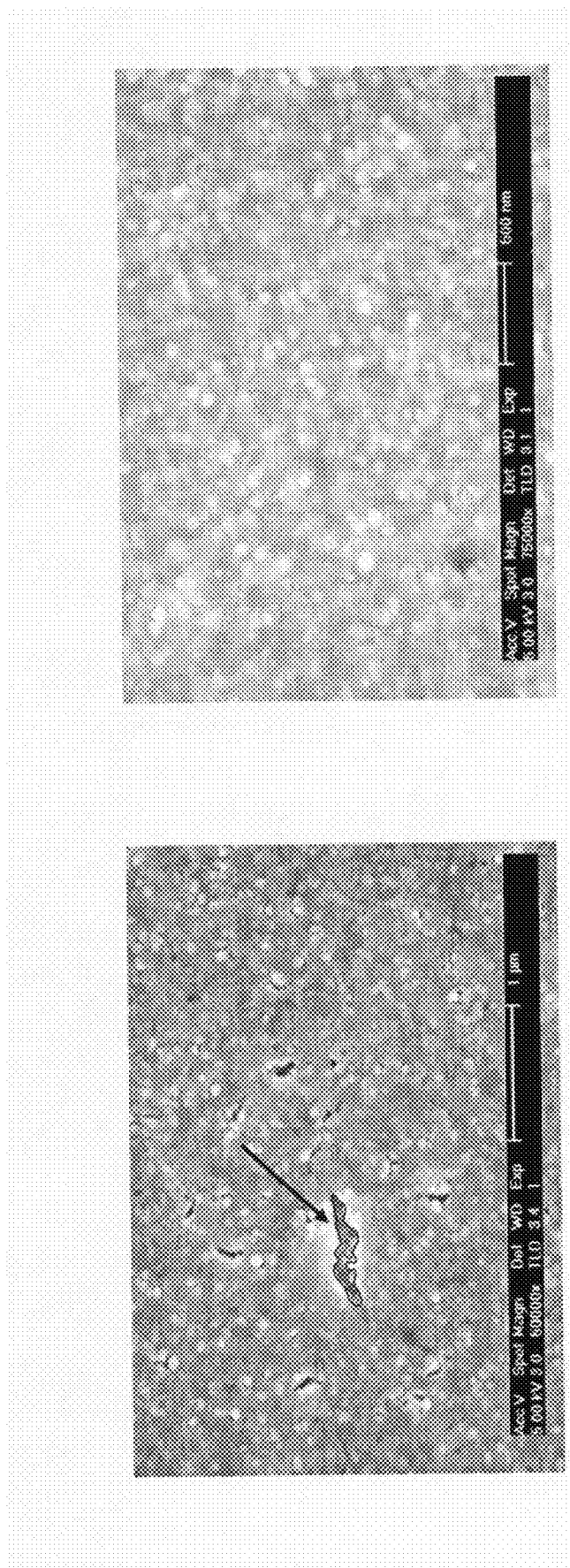
FIG. 5A shows SEM image of a pure-silica zeolite film after removal of the (organic) template by thermal treatment (showing clearly unwanted cracks in the film).
FIG. 5B shows SEM image of a pure-silica zeolite film using the UV treatment of a preferred embodiment (no cracks visible).
Figure 6:
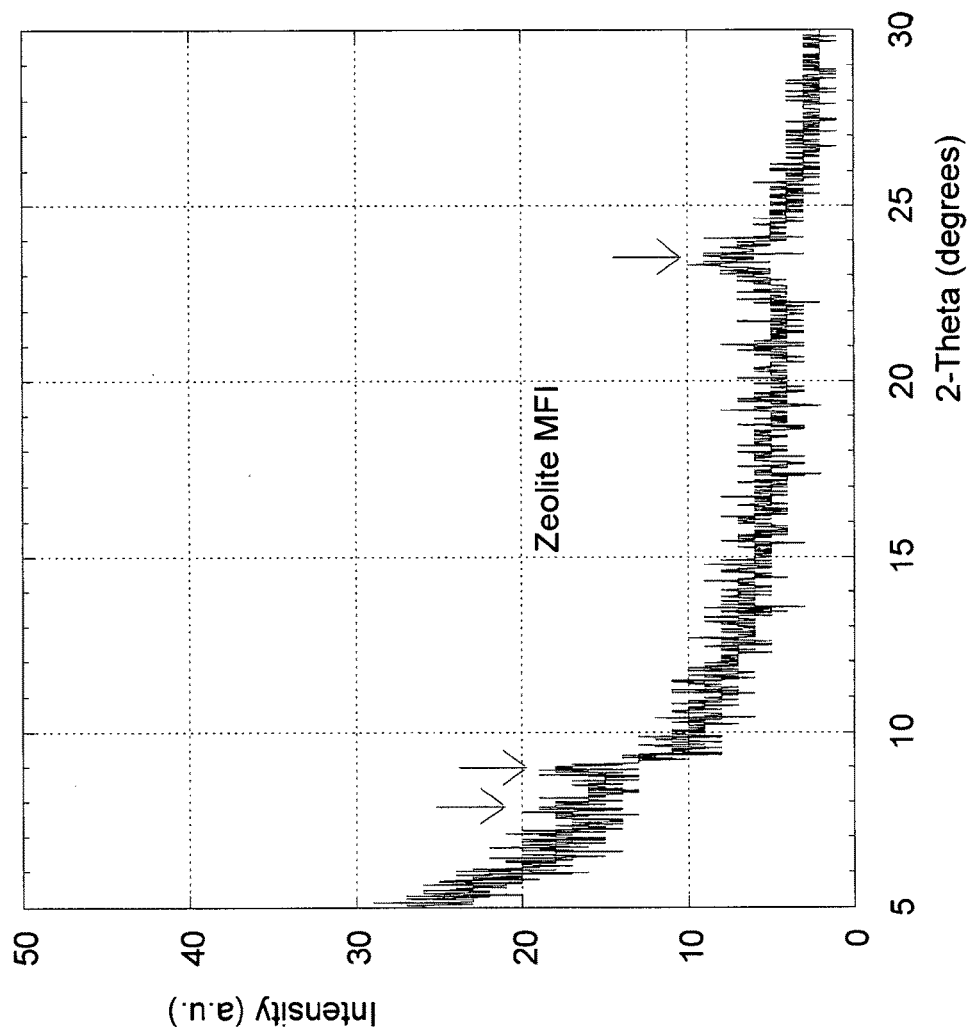
FIG. 6 shows standard incidence XRD results on a reference spin-on silica-zeolite film. The presence of peaks at 2-Theta around 8, 9 and 23 degrees show the presence of zeolite MFI. However, the low intensity of these peaks suggests that the crystallinity of the film is quite low. The reason is the use of the small silica nanoparticles or clusters as 'glue holding entities' of the zeolite nanocrystals and the deficient crystallinity of the zeolite nanocrystals.
Figure 7A:
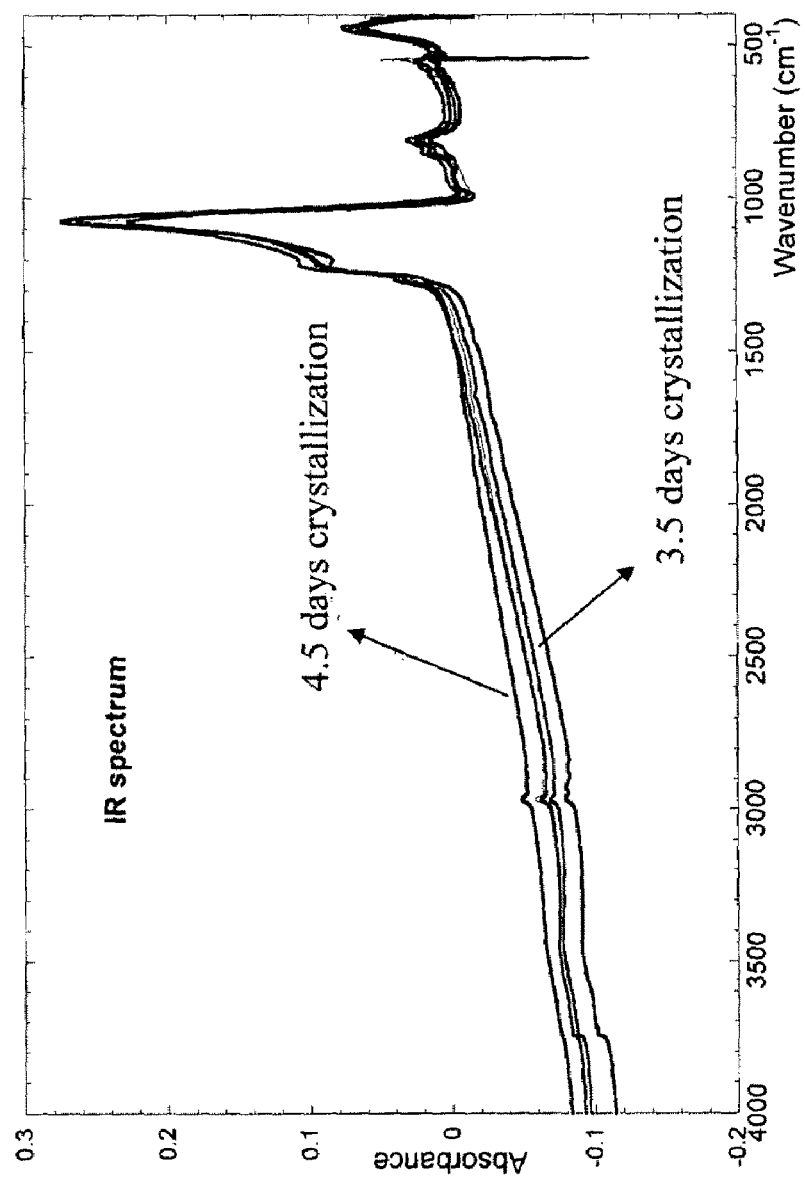
FIG. 7A-7C illustrate FTIR charts demonstrating that the lowest silanol content is found after UV-cure for spin-on zeolites with higher crystallinity ratio, that is, when a longer crystallization time is performed to obtain the pure-silica zeolite suspension.
Figure 7B:
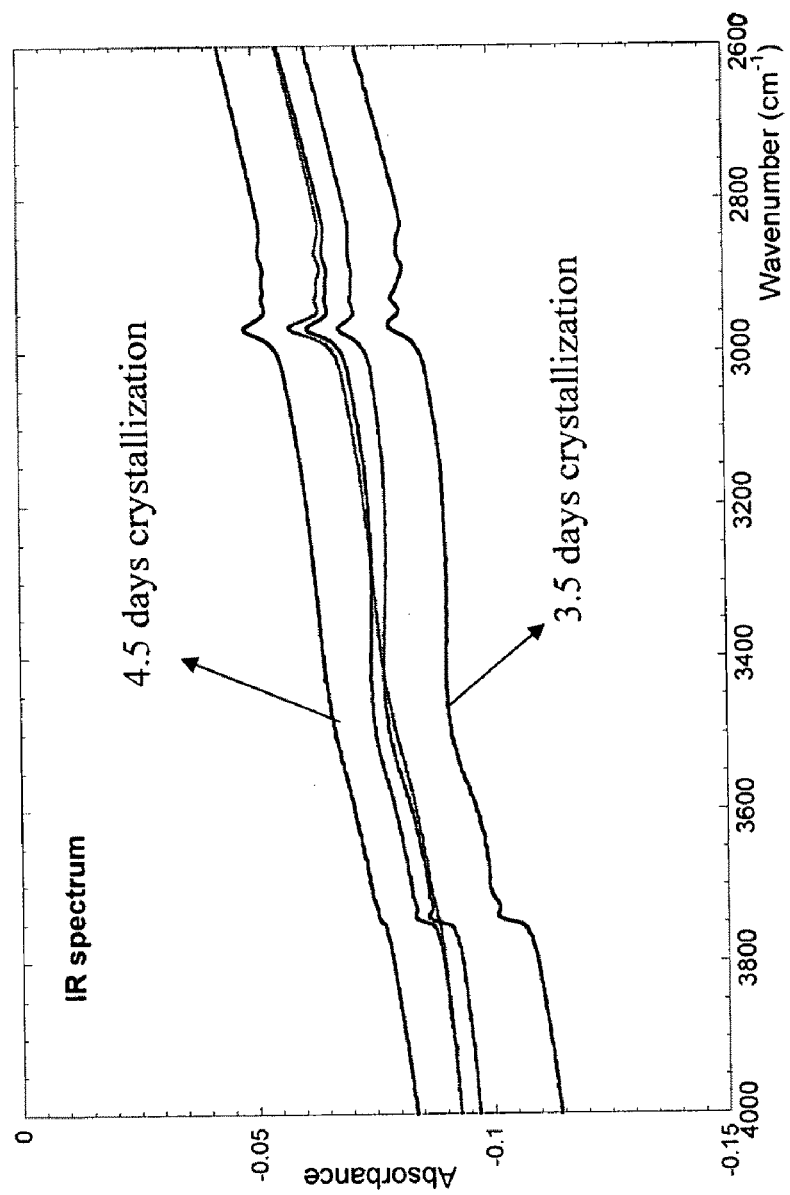
Figure 7C:
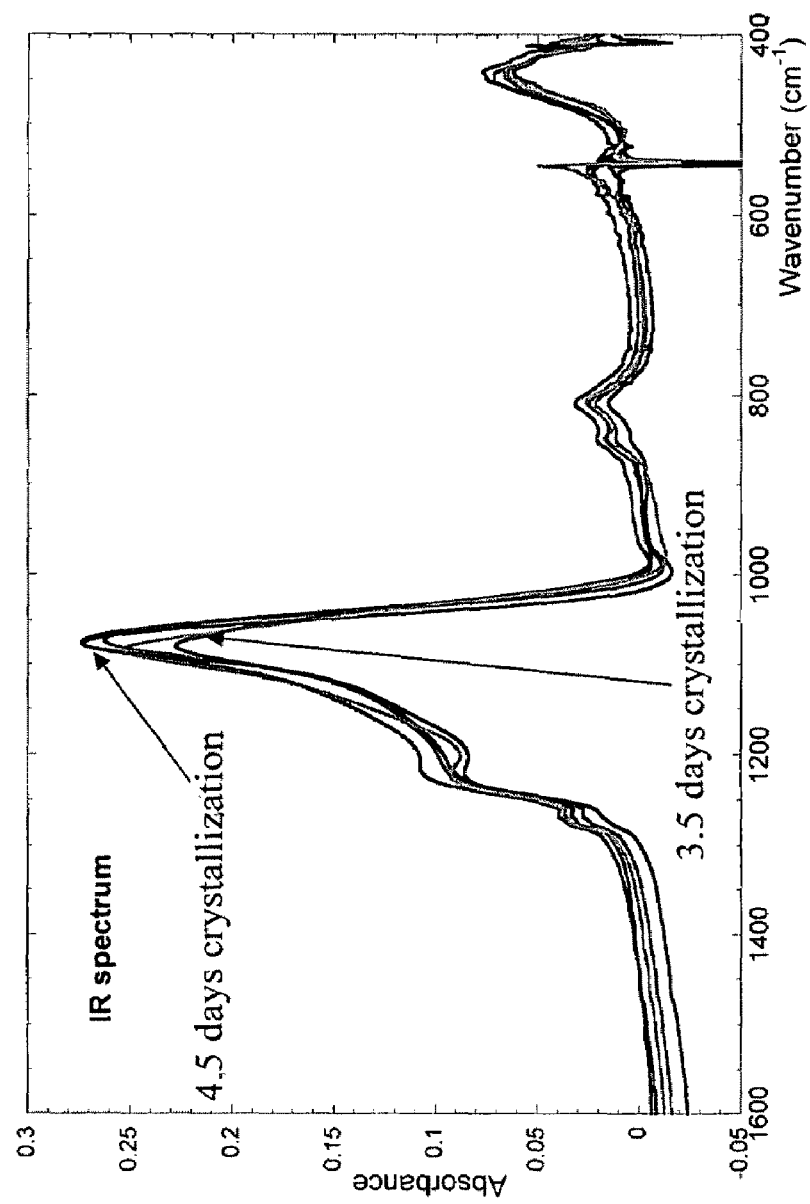

In the case of higher yields (high ratio of zeolite nanocrystals), this shrinkage leads to the formation of cracks in the films (as shown in FIG. 5A), probably due to the collapsing of pores.

When zeolite films are used as insulator in chips, these cracks will lead to the failure of chips because these cracks will create defects on the Cu barrier permitting the Cu diffusion.

This is solved using the UV treatment of the preferred embodiments because although the shrinkage is practically the same, the better cross-linking of the zeolite film avoids the formation of cracks. The silica-zeolite film after UV treatment is shown in FIG. 5B and shows almost no cracks.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for increasing a hydrophobicity of a zeolite film, comprising the steps of:
    providing a support and a zeolite synthesis composition, the zeolite synthesis composition comprising a silica source and an organic template;
    forming a zeolite film on the support, wherein the zeolite film is derived from the zeolite synthesis composition and wherein total removal of the organic template is avoided; and thereafter
    subjecting said zeolite film to, substantially simultaneously, ultraviolet irradiation and thermal activation, wherein the ultraviolet radiation has a wavelength of from 170 nm to 250 nm, and wherein organic template is present when the zeolite film is subjected to ultraviolet radiation, whereby Si—OH bonds are broken and whereby Si—O—Si, Si—CH$_3$ and/or Si—O—CH$_3$ bonds are formed, whereby hydrophobicity of the zeolite film is increased.

2. The method according to claim 1, wherein said zeolite film is formed on said support by an in-situ crystallization process.

3. The method according to claim 1, wherein said zeolite film is formed on said substrate by a spin-on process.

4. The method according to claim 3, wherein forming a zeolite film on a support comprises depositing a suspension of zeolite nanocrystals having an average particle size of from about 50 nm to about 70 nm on said support.

5. The method according to claim 4, wherein said suspension of zeolite nanocrystals further comprises at least one of smaller silica nanoparticles and clusters of smaller silica nanoparticles.

6. The method according to claim 1, wherein said zeolite film comprises at least one zeolite selected from the group consisting of MFI zeolite, MEL zeolite, and BEA zeolite.

7. The method according to claim 1, wherein said zeolite film is a pure-silica-zeolite film.

8. The method according to claim 1, wherein said support is selected from the group consisting of a silicon wafer, a polymeric support, a porous alumina support, and a ceramic support.

9. The method according to claim 1, wherein said silica source comprises an organic silica.

10. The method according to claim 9, wherein the organic silica is selected from the group consisting of tetraethyl orthosilicate, tetramethyl orthosilicate, and mixtures thereof.

11. The method according to claim 1, wherein said silica source comprises an inorganic silica.

12. The method according to claim 11, wherein the inorganic silica is selected from the group consisting of fumed silica, silica gel, colloidal silica, and mixtures thereof.

13. The method according to claim 1, wherein said organic template comprises an organic hydroxide.

14. The method according to claim 13, wherein the organic hydroxide comprises a quaternary ammonium hydroxide selected from the group consisting of tetrapropylammonium hydroxide, tetraethylammonium hydroxide, triethyl-n-propyl ammonium hydroxide, benzyl-trimethylammonium hydroxide, and mixtures thereof.

15. The method according to claim 1, wherein said thermal activation is conducted at a temperature higher than about 100° C.

16. The method according to claim 1, wherein said thermal activation is conducted at a temperature higher than about 150° C.

17. The method according to claim 1, wherein said thermal activation is conducted at a temperature higher than about 200° C.

18. The method according to claim 1, wherein said thermal activation is conducted at a temperature higher than about 300° C.

19. The method according to claim 1, wherein said thermal activation is conducted at a temperature from about 350° C. to about 550° C.

20. The method according to claim 1, wherein said thermal activation is conducted at a temperature of about 425° C.

21. The method according to claim 1, further comprising a step of drying said zeolite film, wherein said drying step is conducted at a temperature of up to 80° C. and before the step of subjecting said zeolite film to, substantially simultaneously, ultraviolet irradiation and thermal activation.

22. A zeolite film prepared by a method comprising:
    providing a support and a zeolite synthesis composition, the zeolite synthesis composition comprising a silica source and an organic template;
    forming a zeolite film on the support, wherein the zeolite film is derived from the zeolite synthesis composition and wherein total removal of the organic template is avoided; and thereafter
    subjecting said zeolite film to, substantially simultaneously, ultraviolet irradiation and thermal activation, wherein the ultraviolet radiation has a wavelength of from 170 nm to 250 nm, and wherein organic template is present when the zeolite film is subjected to ultraviolet radiation, whereby Si—OH bonds are broken and whereby Si—O—Si, Si—CH$_3$ and/or Si—O—CH$_3$ bonds are formed, whereby hydrophobicity of the zeolite film is increased.

23. The zeolite film according to claim 22, wherein the zeolite film functions as a membrane.

24. A semiconductor device comprising a zeolite film, wherein the zeolite film is prepared by a method comprising:
    providing a support and a zeolite synthesis composition, the zeolite synthesis composition comprising a silica source and an organic template;
    forming a zeolite film on the support, wherein the zeolite film is derived from the zeolite synthesis composition and wherein total removal of the organic template is avoided; and thereafter
    subjecting said zeolite film to, substantially simultaneously, ultraviolet irradiation and thermal activation, wherein the ultraviolet radiation has a wavelength of from 170 nm to 250 nm, and wherein organic template is present when the zeolite film is subjected to ultraviolet radiation, whereby Si—OH bonds are broken and whereby Si—O—Si, Si—CH$_3$ and/or Si—O—CH$_3$ bonds are formed, whereby hydrophobicity of the zeolite film is increased.

25. The semiconductor device of claim 24, wherein the zeolite film functions as a low-k material.

* * * * *